(12) United States Patent
Imai

(10) Patent No.: US 7,482,614 B2
(45) Date of Patent: Jan. 27, 2009

(54) RADIATION IMAGE DETECTOR

(75) Inventor: Shinji Imai, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/520,761

(22) Filed: Sep. 14, 2006

(65) Prior Publication Data

US 2007/0069164 A1   Mar. 29, 2007

(30) Foreign Application Priority Data

Sep. 27, 2005   (JP) .............................. 2005-279099

(51) Int. Cl.
*H01L 31/00* (2006.01)
(52) U.S. Cl. ...................... 250/591; 250/580
(58) Field of Classification Search ................. 250/580, 250/591
See application file for complete search history.

(56) References Cited

U.S. PATENT DOCUMENTS

| | | |
|---|---|---|
| 6,770,901 B1 | 8/2004 | Ogawa et al. |
| 2003/0034464 A1 | 2/2003 | Ogawa |
| 2003/0098427 A1 | 5/2003 | Ogawa |
| 2005/0133744 A1 | 6/2005 | Imai |
| 2005/0280109 A1 | 12/2005 | Imai |

FOREIGN PATENT DOCUMENTS

| | | |
|---|---|---|
| JP | 2003-031836 A | 1/2003 |
| JP | 2003-218335 A | 7/2003 |

OTHER PUBLICATIONS

European Search Report dated Aug. 30, 2007.

*Primary Examiner*—David P Porta
*Assistant Examiner*—Djura Malevic
(74) *Attorney, Agent, or Firm*—Sughrue Mion, PLLC

(57) ABSTRACT

A radiation image detector including the following in the order listed below: a charge storage layer that generates and stores charges by receiving a recording electromagnetic wave representing a radiation image; a photoconductive layer that generates charges by receiving readout light; and an electrode layer having a plurality of first line electrodes that transmits the readout light and is disposed in parallel at a predetermined distance. Further, a second line electrode having electrical continuity with the photoconductive layer is provided between each of the first electrodes, and an opaque line insulator that blocks the readout light is provided on each second line electrode on the side opposite to the photoconductive layer. The opaque line insulator has such a width that a side face portion of the opaque line insulator resides between the opposing side face portions of adjacent first and second line electrodes.

6 Claims, 7 Drawing Sheets

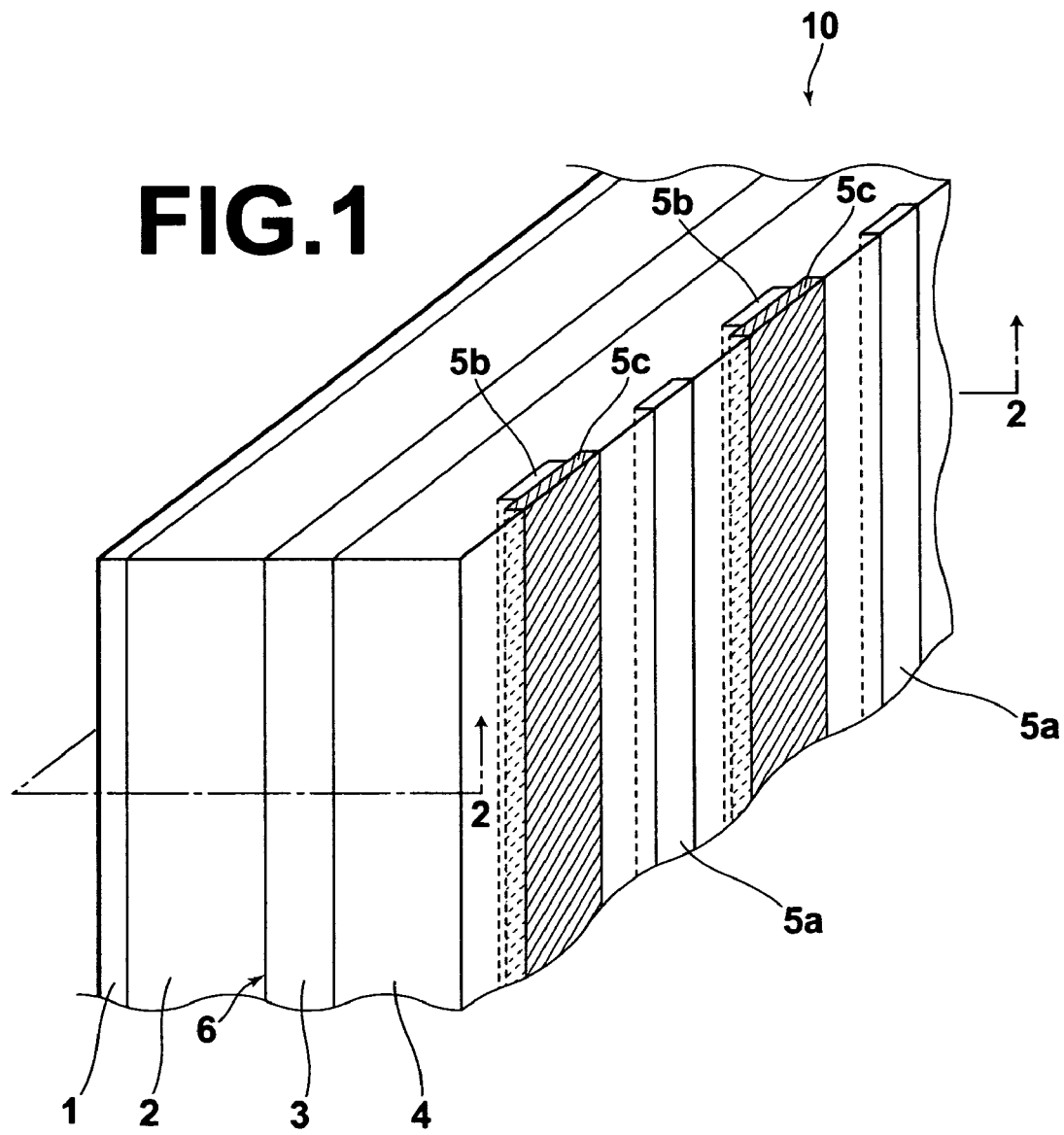

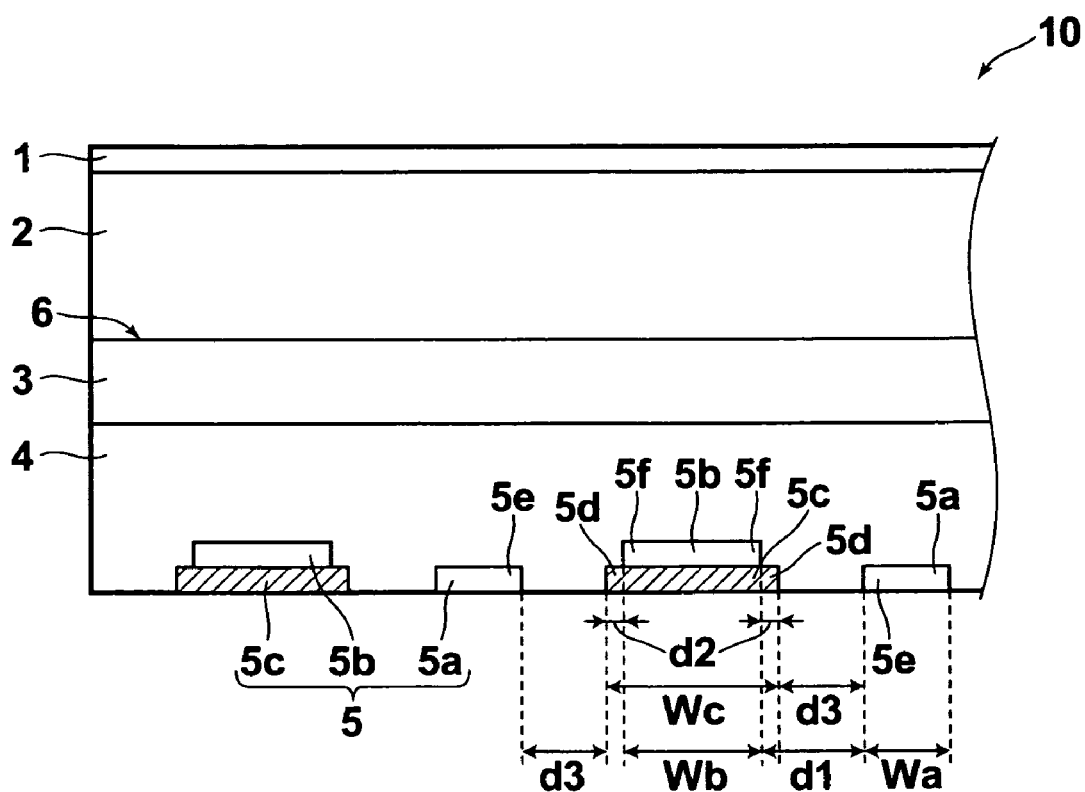

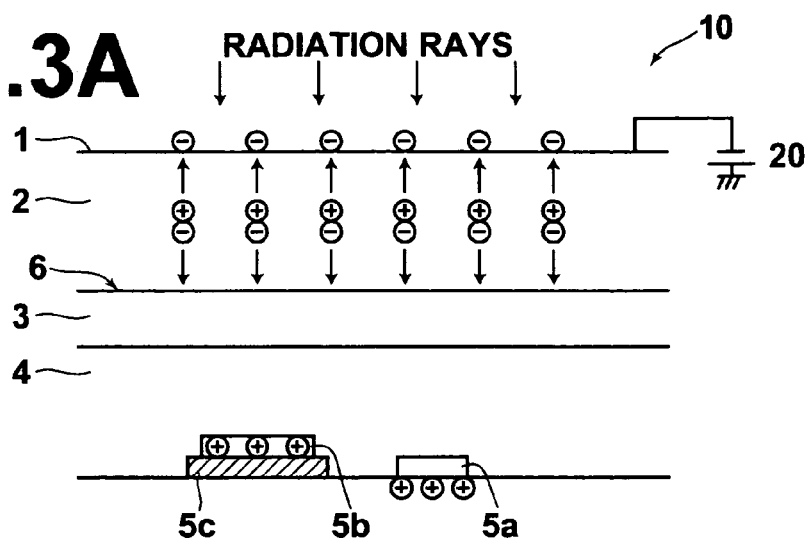
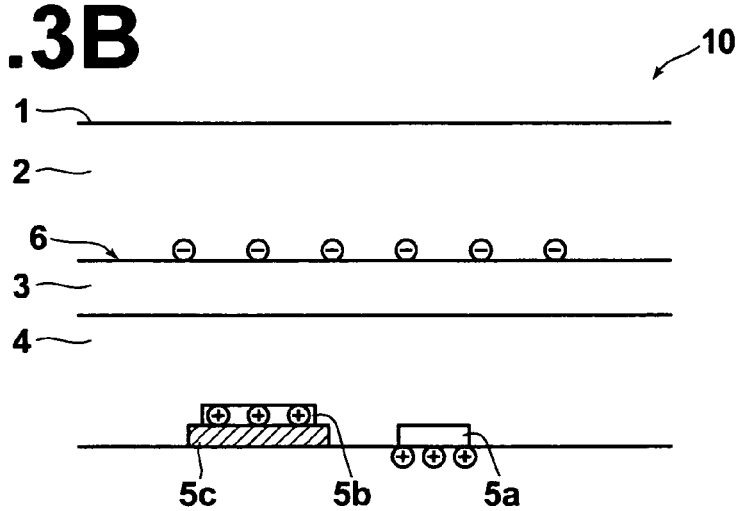
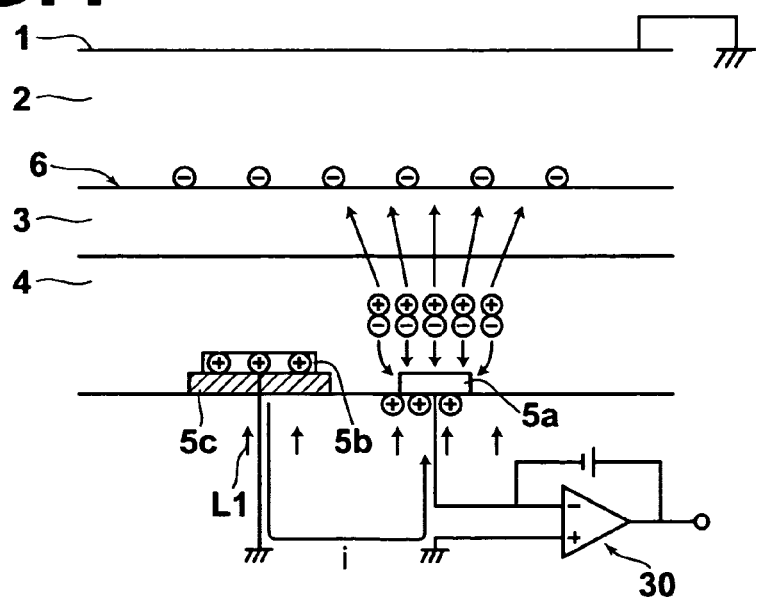

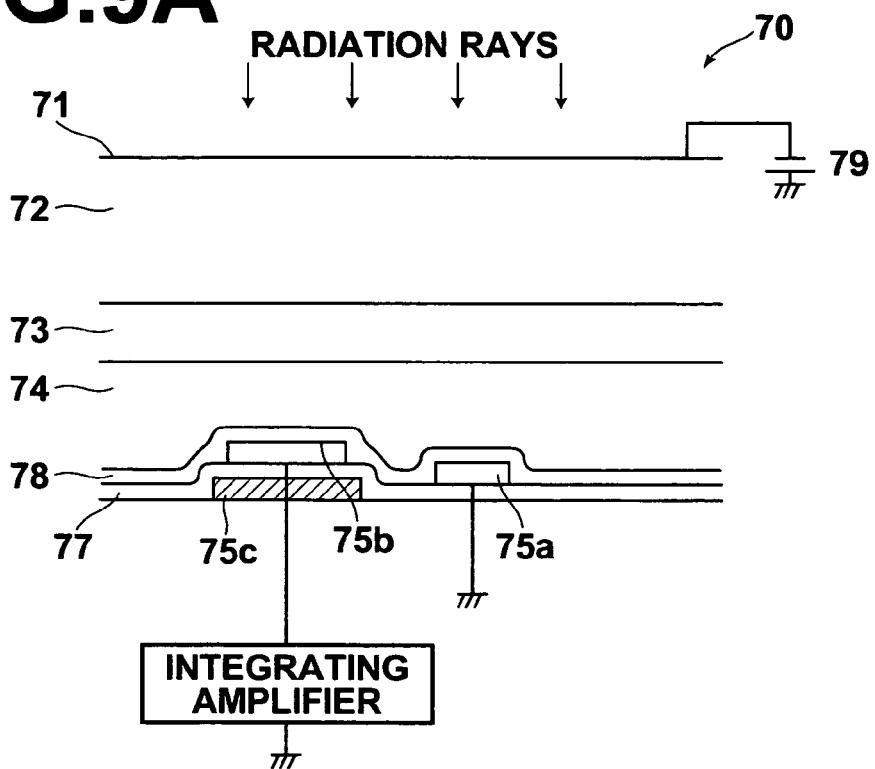
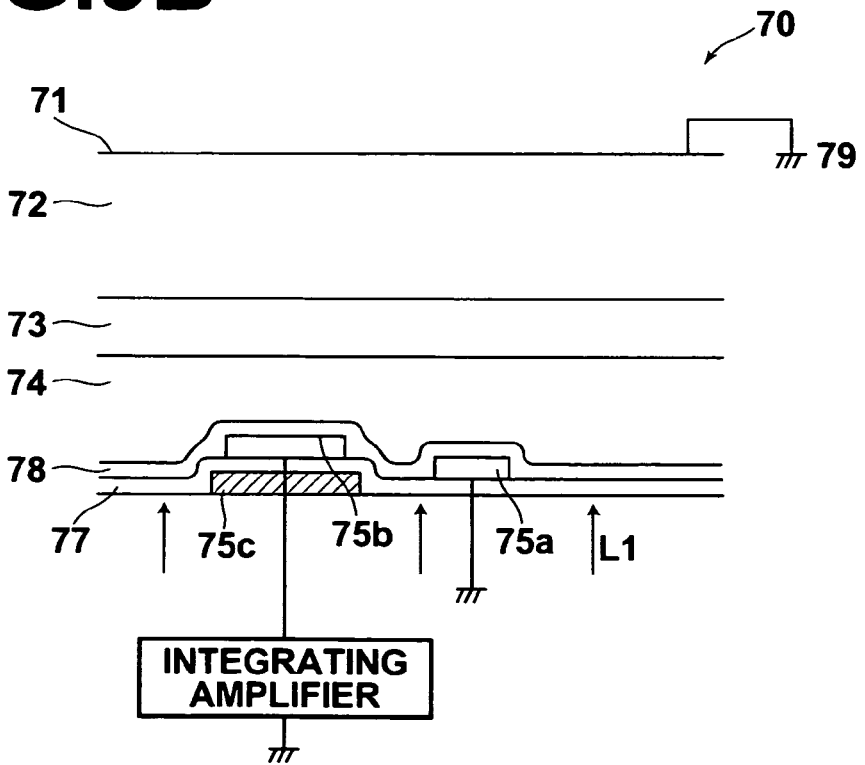

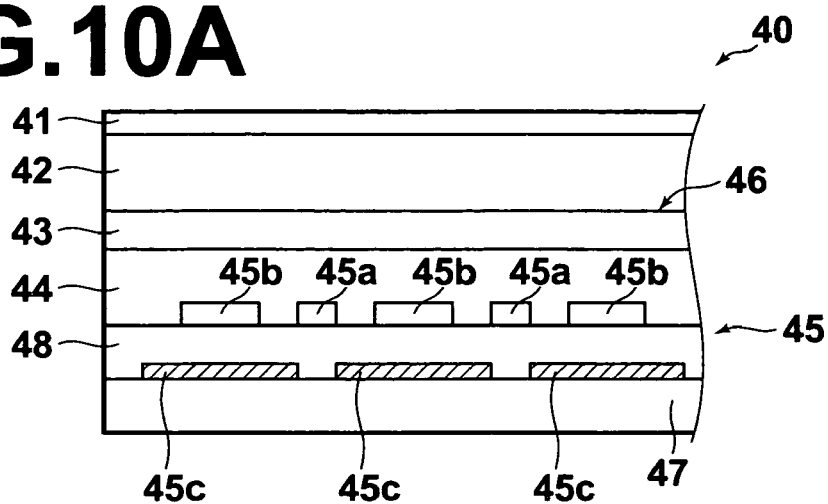
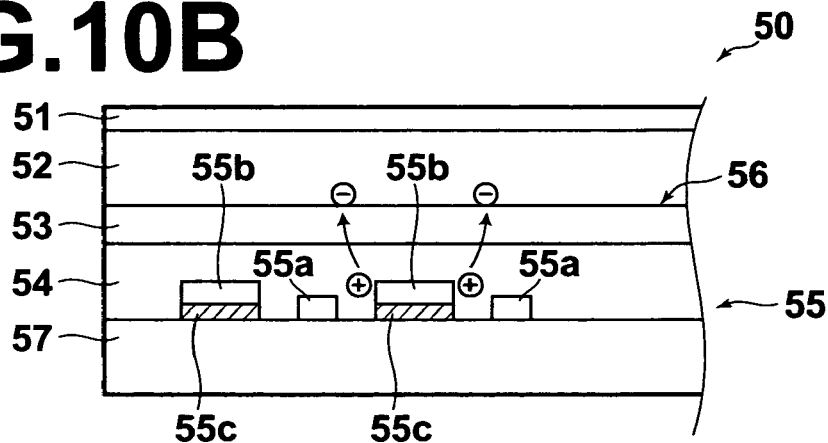
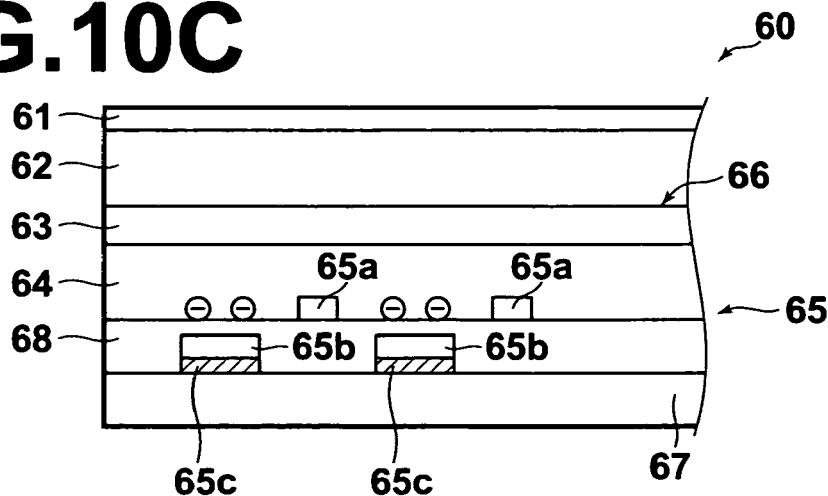

RADIATION IMAGE DETECTOR

BACKGROUND OF THE INVENTION

1. Field of the Invention

The present invention relates to a radiation image detector that receives radiation representing a radiation image to record the radiation image therein, and outputs signals in proportion to the radiation image recorded therein when scanned with readout light.

2. Description of the Related Art

Various types of radiation image detectors are proposed and put into practical use in the medical and other industrial fields. These detectors generate electric charges by receiving radiation transmitted through a subject and record a radiation image of the subject by storing the electric charges.

One such radiation image detector is proposed, for example, in U.S. Pat. No. 6,770,901. The detector is constituted by a layer structure that includes the following in the order listed below: a first electrode layer that transmits radiation; a recording photoconductive layer that generates electric charges by receiving radiation; a charge transport layer that acts as an insulator against the latent image charges and as a conductor for the electric charges of opposite polarity to the latent image charges; a readout photoconductive layer that generates electric charges by receiving readout light; and a second electrode layer that includes linearly extending transparent line electrodes that transmit readout light, and linearly extending opaque line electrodes that block the readout light disposed alternately in parallel with each other.

When recording a radiation image using the radiation image detector formed in the manner as described above, radiation transmitted through a subject is irradiated on the detector from the side of the first electrode layer with a negative high voltage being applied to the first electrode layer. The radiation irradiated on the detector in the manner described above is transmitted through the first electrode layer and irradiated on the recording photoconductive layer. Then, electric charge pairs are generated in the area of the recording photoconductive layer where the radiation is irradiated, and the positive charges of the charge pairs move to the negatively charged first electrode layer, where they combine with the negative charges charged thereon and disappear. In the mean time, the negative charges of the charge pairs generated in the manner as described above move toward the positively charged second electrode layer, but they are blocked by the charge transport layer since it acts as an insulator against negative charges, and accumulated at the interface between the recording photoconductive layer and the charge transport layer called a storage section. This accumulation of the negative charges in the storage section constitutes the recording of the radiation image.

When reading out the radiation image recorded in the manner as described above, readout light is irradiated on the detector from the side of the second electrode layer. The readout light irradiated on the detector is transmitted through the transparent line electrodes of the second electrode layer and irradiated on the readout photoconductive layer, whereby electric charge pairs are generated in the readout photoconductive layer. The positive charges of the charge pairs generated in the readout photoconductive layer combine with the negative charges stored in the storage section, while the negative charges of the charge pairs combine with the positive charges charged on the transparent line electrodes, whereby electric currents are detected by current detection amplifiers connected to the transparent line electrodes, which are then converted to voltage values and outputted as image signals.

According to the radiation image detector having opaque electrodes that block the readout light, the radiation irradiated toward the area of the readout photoconductive layer corresponding to each of the opaque line electrodes is blocked when the image is read out. This prevents the discharge of the electric charges between the storage section having the latent image stored therein and the opaque line electrodes, so that the amount of electric charges in the area of the readout photoconductive layer adjacent to each of the transparent line electrodes may relatively be increased compared with the case where no such opaque line electrode is provided. Thus, the amount of signal charges obtainable from the radiation image detector to outside through the transparent line electrodes may relatively be increased compared with the case where no such opaque line electrode is provided, whereby readout efficiency is improved.

Here, Japanese Unexamined Patent Publication No. 2003-031836 discloses one of the methods for forming the opaque line electrodes. In the method, an opaque film 45c that blocks readout light is provided on the side of each of the transparent line electrodes 45b from which the readout light is irradiated as shown in FIG. 10A. The radiation image detector 40 shown in FIG. 10A is constituted by a layer structure that includes the following in the order listed below: a first electrode layer 41, a recording photoconductive layer 42, a charge transport layer 43, a readout photoconductive layer 44, a second electrode layer 45, and a glass substrate 47. The second electrode layer 45 includes transparent line electrodes 45a that transmit readout light, and opaque line electrodes, each constituted by a line electrode 45b that transmits the readout light and the opaque film 45c that blocks the readout light. An insulation layer 48 is provided between the transparent line electrodes 45a/line electrodes 45b and the opaque films 45c.

In the radiation image detector 40 according to the Japanese Unexamined Patent Publication No. 2003-031836, each of the opaque film 45c is provided such that it covers the region corresponding to the area of the readout photoconductive layer 44 between the side faces of adjacent transparent line electrodes 45a as shown in FIG. 10A, so that electric charges in the areas of the readout photoconductive layer 44 adjacent to the edges of each of the transparent line electrodes 45a are not fully discharged, causing degradation in the readout efficiency by that much.

Further, Japanese Unexamined Patent Publication No. 2003-218335 proposes a method for forming the opaque line electrodes by providing opaque films 55c or 65c on the side of the transparent line electrodes 55b or 65b from which readout light is irradiated as shown in FIG. 10B or 10C.

In the radiation image detector 50 or 60 disclosed in Japanese Unexamined Patent Publication No. 2003-218335, each opaque film 55c or 65c is provided such that it extends only to the side edges of each line electrode 55b or 65b as shown in FIG. 10B or 10C, so that the electric charges in the areas of the readout photoconductive layer 44 adjacent to the edges of each of the line electrodes 55b or 65b are discharged, causing degradation in the readout efficiency by that much. The radiation image detector 50 shown in FIG. 10B is constituted by a layer structure that includes the following in the order listed below: a first electrode layer 51, a recording photoconductive layer 52, a charge transport layer 53, a readout photoconductive layer 54, a second electrode layer 55, and a glass substrate 57. The second electrode layer 55 includes transparent line electrodes 55a that transmit readout light and opaque line electrodes, each constituted by a line electrode 55b that transmits readout light and the opaque film 55c that blocks readout light. The radiation image detector 60 shown in FIG. 10C is constituted by a layer structure that includes the following in the order listed below: a first electrode layer 61, a recording photoconductive layer 62, a charge transport layer 63, a readout photoconductive layer 64, a second electrode layer 65, and a glass substrate 67. The second electrode layer 65 includes transparent line electrodes 65*a* that transmit readout light and opaque line electrodes, each constituted by a line electrode 65*b* that transmits the readout light and the opaque film 65*c* that blocks readout light. Further an insulation layer 68 is provided between the transparent line electrodes 65*a* and opaque line electrodes.

In the mean time, in the radiation image detectors described above, residual charges remaining in the storage section are erased after the image is read out in the manner as described above. More specifically, erasing light is irradiated on the detector from the side of the second electrode layer, which causes electric charge pairs to be generated in the readout photoconductive layer, and charges of either polarity combine with the residual charges remaining in the storage section, whereby the residual charges are erased.

However, for example, as in the radiation image detector 60 shown in FIG. 10C, if the insulation layer 68 is provided on the surface of the opaque line electrodes, the electric charges of the other polarity of the charge pairs generated by the erasing light in the manner as described above remain on the insulation layer 68 as shown in FIG. 10C. These charges remaining on the insulation layer 68 appear as a residual image on the image obtained in the next radiation image recording and readout process.

The present invention has been developed in view of the circumstances described above, and it is an object of the present invention to provide a radiation image detector, which includes opaque line electrodes that block readout light, capable of improving readout efficiency and preventing the occurrence of the residual image described above.

SUMMARY OF THE INVENTION

A radiation image detector of the present invention comprises a layer structure that includes the following in the order listed below:

a charge storage layer that generates charges by receiving a recording electromagnetic wave representing a radiation image and stores the generated charges therein;

a photoconductive layer that generates charges by receiving readout light;

an electrode layer having a plurality of first line electrodes that transmits the readout light and is disposed in parallel with each other at a predetermined distance, wherein:

a second line electrode having electrical continuity with the photoconductive layer is provided between each of the first electrodes, and an opaque line insulator that blocks the readout light is provided on each of the second line electrodes on the side opposite to the photoconductive layer; and the opaque line insulator has such a width that a side face portion of the opaque line insulator extending in the longitudinal direction thereof resides between the opposing side face portions of adjacent first and second line electrodes extending in the longitudinal direction thereof.

In the radiation image detector of the present invention, a configuration may be adopted in which the opaque line insulator has such a width that the distance between the side faces on the same side of the opaque line insulator extending in the longitudinal direction thereof and the second line electrode extending in the longitudinal direction thereof is greater than the wavelength of the readout light.

Further, a configuration may be adopted in which the opaque line insulator has such a width that the distance between the opposing side faces of adjacent opaque line insulator extending in the longitudinal direction thereof and first line electrode extending in the longitudinal direction thereof is greater than or equal to the wavelength of the readout light.

Still further, a configuration may be adopted in which the photoconductive layer generates charges by receiving erasing light for erasing residual charges remaining in the charge storage layer, and the second line electrodes and the opaque line insulators transmit the erasing light.

According to the radiation image detector of the present invention, a second line electrode having electrical continuity with the photoconductive layer is provided between each of the first line electrodes, and an opaque line insulator that blocks the readout light is provided on each of the second line electrodes on the side opposite to the photoconductive layer, and the opaque line insulator has such a width that a side face portion of the opaque line insulator extending in the longitudinal direction thereof resides between the opposing side face portions of adjacent first and second line electrodes extending in the longitudinal direction thereof. This arrangement allows the charges in the areas of the photoconductive layer adjacent to the edges of each of the first line electrodes to be discharged satisfactorily, and may prevent the charges in the areas of the photoconductive layer adjacent to the edges of each of the second electrodes from discharging, thus the readout efficiency may be improved.

Further, the second line electrodes have electrical continuity with the photoconductive layer. This may prevent the residual charges from remaining on the insulation layer as in the radiation image detector shown in FIG. 10C after erasing process is performed, thereby occurrence of the residual image may be prevented.

BRIEF DESCRIPTION OF THE DRAWINGS

FIG. 1 is a schematic diagram of the radiation image detector according to a first embodiment of the present invention, illustrating the construction thereof.

FIG. 2 is a cross-sectional view of the radiation image detector shown in FIG. 1 taken along the line 2-2 in FIG. 1.

FIGS. 3A and 3B are explanatory diagrams explaining the operation of the radiation image detector shown in FIG. 1 when a radiation image is recorded therein.

FIG. 4 is an explanatory diagram explaining the operation of the radiation image detector shown in FIG. 1 when a radiation image is read out therefrom.

FIGS. 9A and 9B are drawings illustrating the radiation image detector used for obtaining the measured data shown in FIG. 8.

FIGS. 10A to 10C are schematic diagrams of conventional radiation image detectors illustrating the construction thereof.

DESCRIPTION OF THE PREFERRED EMBODIMENTS

Figure 5:
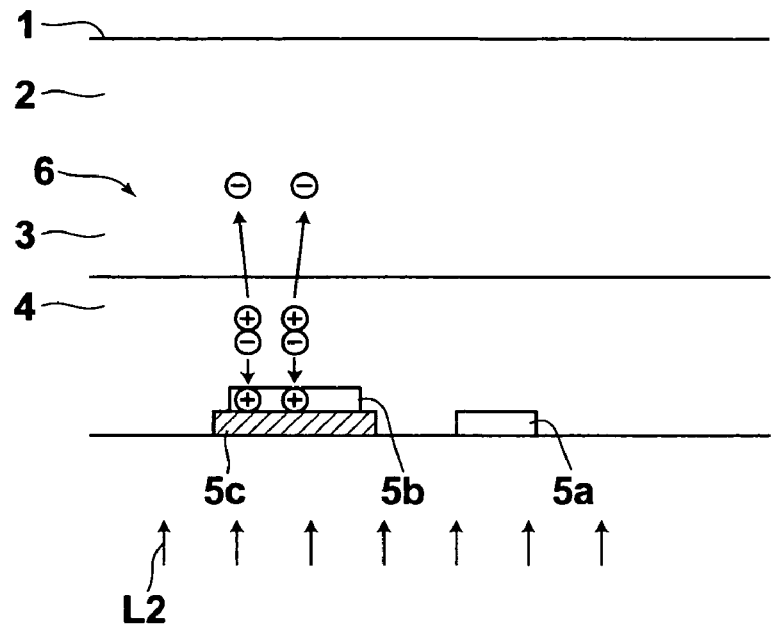
FIG. 5 is an explanatory diagram explaining the operation of the radiation image detector shown in FIG. 1 when residual charges are erased.

Hereinafter, an embodiment of the radiation image detector of the present invention will be described with reference to accompanying drawings. FIG. 1 is a perspective view of the radiation image detector of the present embodiment. FIG. 2 is a cross-sectional view of the radiation image detector shown in FIG. 1 taken along the line 2-2 in FIG. 1.

As shown in FIGS. 1 and 2, the radiation image detector 10 of the present embodiment is constituted by a layer structure that includes the following in the order listed below: a first electrode layer 1 that transmits radiation representing a radiation image; a recording photoconductive layer 2 that generates electric charges by receiving the radiation transmitted through the first electrode layer 1; a charge transport layer 3 that acts as an insulator against the charges of either polarity and as a conductor for the charges of the other polarity generated in the recording photoconductive layer 2; a readout photoconductive layer 4 that generates electric charges by receiving readout light; and a second electrode layer 5 having a plurality of first line electrodes 5a that transmits the readout light, a plurality of second line electrodes 5d, each of which is disposed between each of the first line electrodes 5a, and an opaque line insulator 5c provided on each of the second line electrodes on the side opposite to the readout photoconductive layer 4. In addition, a storage section 6 for storing the electric charges generated in the recording photoconductive layer 2 is formed between the recording photoconductive layer 2 and charge transport layer 3. The layers described above are built up on a glass substrate from the second electrode layer 5, but the glass substrate is omitted in FIGS. 1 and 2.

The first electrode layer 1 may be made of any material as long as it transmits radiation. For example, a NESA film ($SnO_2$), ITO (Indium Tin Oxide), IDIXO (Indemitsu Indium X-metal Oxide, Idemitsu Kosan Co., Ltd.), which is an amorphous state transparent oxide film, or the like with a thickness in the range from around 50 to around 200 nm may be used. Alternatively, Al, or Au with a thickness of 100 nm may also be used.

The second electrode layer 5 includes the first line electrodes 5a and the second line electrodes 5b which are disposed alternately in parallel at a predetermined distance as shown in FIG. 1.

The first line electrode 5a is made of an electrically conductive material which transmits the readout light and erasing light to be described later. It may be made of any material as long as it has the properties described above. Such materials include, for example, ITO and IDIXO as in the first electrode layer 1. Alternatively, the electrode 5a may be formed with a metal such as Al, Cr, or the like with a thickness that allows the readout light and the erasing light to transmit therethrough (e.g., around 10 nm).

The second line electrode 5b is made of an electrically conductive material which transmits the erasing light. It may be made of any material as long as it has the properties described above. Such materials include, for example, ITO and IDIXO as in the first line electrode 5a. Alternatively, the electrode 5b may be formed with a metal such as Al, Cr, or the like with a thickness that allows the erasing light to transmit therethrough (e.g., around 10 nm).

Preferably, the width Wa of the first line electrode 5a and the width Wb of the second line electrode 5b in the arrangement direction are, for example, around 10 μm and around 15 μm respectively (FIG. 2). Preferably, the distance d1 between the first line electrode 5a and the second line electrode 5b is, for example, around 12.5 μm.

The second line electrode 5b needs to be electrically continuous with the readout photoconductor 4. In the present embodiment, the readout photoconductive layer 4 is provided directly on the surface of the second line electrode 5b.

Figure 7:
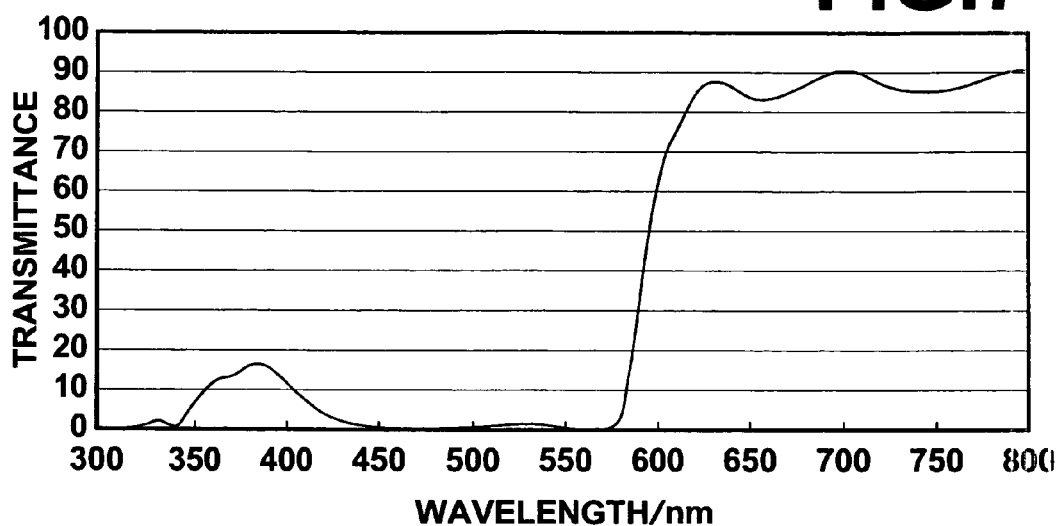
FIG. 7 is a graph illustrating an example optical transmittance of a material used for an opaque line insulator.

As shown in FIGS. 1 and 2, the opaque line insulator is provided on each of the second line electrodes 5b along the longitudinal direction thereof on the side opposite to the readout photoconductive layer 4. The opaque line insulator 5c is made of an insulation material which blocks the readout light and transmits the erasing light. It may be made of any material as long as it has the properties described above. If, for example, the readout light is blue light having a wavelength in the range from 400 nm to 480 nm, and the erasing light is red light having a wavelength in the range from 580 to 700 nm, a red insulation material, which is in complementary relationship with blue, may be used. Such materials include, for example, acrylate resin with diaminoanthraquino nilred dispersed therein, and the like. A preferred characteristic of the optical transmittance of a material used for the opaque line insulator 5c when blue light is used as the readout light is shown in FIG. 7.

If the readout light is red light having a wavelength in the range from 580 nm to 700 nm, and the erasing light is blue light having a wavelength in the range from 400 to 480 nm, a blue insulation material, which is in complementary relationship with red, may be used. Such material includes, for example, acrylate resin with copper phthalocyanine dispersed therein, and the like. That is, the materials that may be used for the opaque line insulator 5c are not limited to those described above, and any insulation material having the same color as the erasing light, which is in complementary color relationship with the wavelength of the readout light, may be used.

As shown in FIG. 2, the width Wc of the opaque line insulator Sc in the arrangement direction is selected such that a side face portion 5d of the opaque line insulator 5c extending in the longitudinal direction thereof resides between the opposing side face portions 5e and 5f of adjacent first line electrode 5a and second line electrode 5b extending in the longitudinal direction thereof.

Preferably, the width Wc of the opaque line insulator 5c in the arrangement direction is selected such that the distance between the side faces on the same side of the opaque line insulator 5c extending the longitudinal direction thereof and the second line electrode 5b extending in the longitudinal direction thereof is greater than or equal to the wavelength of the readout light. That is, the width d2 shown in FIG. 2 is preferable to be greater than or equal to the wavelength of the readout light. Preferably, if the readout light is blue light, the width d2 is from 2 μm to 3 μm, more preferably around 2.5 μm. That is, the width d2 is preferable to be approximately five times as great as the wavelength of the readout light.

Preferably the width Wc of the opaque line insulator 5c in the arrangement direction is selected such that the distance between the opposing side faces of adjacent opaque line insulator 5c extending in the longitudinal direction thereof and first line electrode 5a extending in the longitudinal direction thereof is greater than or equal to the wavelength of the readout light. That is, the width d3 shown in FIG. 2 is preferable to be greater than or equal to the wavelength of the readout light.

Accordingly, for example, if the width Wa of the first line electrode 5a is 10 μm, the width Wb of the second line electrode 5b is 15 μm, the distance d1 between the first line electrode 5a and the second line electrode 5b is 12.5 μm, and blue light is used as the readout light, then the width Wc of the opaque line insulator 5c in the arrangement direction is preferable to be 20 μm to 35 μm.

The recording photoconductive layer 2 may be made of any material as long as it generates electric charges by receiving radiation. Here, a material that includes a-Se as the major component is used, since a-Se has superior properties, such as relatively high quantum efficiency for radiation, and high dark resistance. Preferably, the thickness of the recording photoconductive layer 2 is around 500 μm.

As for the material of the charge transport layer 3, for example, a material having a greater difference in charge mobility between the charges charged on the first electrode layer 1 and the charges having opposite polarity when a radiation image is recorded (for example, not less than $10^2$, more preferably, not less than $10^3$), is preferably used. In this respect, organic compounds such as polyN-vinylcarbazole (PVK), N,N'-diphenyl-N,N'-bis(3-methylphenyl)-[1,1'-biphenyl]-4,4'-diamine (TPD), discotic liquid crystal, and the like, or semiconductor materials such as TPD-dispersed polymers (polycarbonate, polystyrene, PVK), a-Se doped with 10 to 200 ppm of Cl, and the like are preferably used.

The readout photoconductive layer 4 may be made of any material as long as it generates electric charges by receiving the readout light or erasing light. For example, a photoconductive material that consists mainly of at least one of the materials selected from the group of a-Se, Se—Te, Se—As—Te, nonmetal phthalocyanine, metal phthalocyanine, MgPc (Magnesium phthalocyanie), VoPc (phase II of Vanadyl phthalocyanine), CuPc (Cupper phthalocyanine), and the like is preferably used. Preferably, the thickness of the readout photoconductive layer 4 is around 0.1 μm to around 1.0 μm.

Hereinafter, the operation of the radiation image detector of the present embodiment will be described.

First, radiation is irradiated from a radiation source toward a subject with a negative high voltage being applied from a high voltage source 20 to the first electrode layer 1 of the radiation image detector 10 as shown in FIG. 3A, and the radiation transmitted through the subject and representing a radiation image of the subject is irradiated on the radiation image detector 10 from the side of the first electrode layer 1.

Then, the radiation irradiated on the radiation image detector 10 is transmitted through the first electrode layer 1, and irradiated on the recording photoconductive layer 2, which causes electric charge pairs to be generated in the recording photoconductive layer 2. The positive charges of the charge pairs combine with the negative charges charged on the first electrode layer 1 and disappear, while the negative charges of the charge pairs are stored in the storage section 6 formed at the interface between the recording photoconductive layer 2 and charge transport layer 3 as latent image charges, whereby the radiation image is recorded (FIG. 3B).

Thereafter, with the first electrode layer 1 being grounded as shown in FIG. 4, readout light L1 is irradiated on the radiation image detector 10 from the side of the second electrode layer 5, which is transmitted through the first line electrodes 5a and irradiated on the readout photoconductive layer 4. The positive charges generated in the readout photoconductive layer 4 by the irradiation of the readout light L1 combine with the latent image charges stored in the storage section 6, and the negative charges generated in the readout photoconductive layer 4 combine with positive charges charged on the first line electrodes 5a of the second electrode layer 5.

This negative and positive charge coupling causes electric currents to flow in charge amplifiers 30, which are integrated and detected as image signals, whereby image signals are read out from the radiation image detector 10 in proportion to the radiation image.

Here, in the radiation image detector 10 of the present embodiment, the opaque line insulator 5c is formed with the width as described above, so that the readout light may be irradiated fully without interruption on the areas of the readout photoconductive layer 4 adjacent to the side face portions of each of the first line electrodes 5a, whereby charges in the readout photoconductive layer 4 may be fully discharged, resulting in improved readout efficiency.

Further, the provision of the opaque line insulator 5c having such width as described above may prevent the readout light from being irradiated on the areas of the readout photoconductive layer 4 adjacent to the side face portions of each of the second line electrodes 5b, and the electric charges in the areas of the readout photoconductive layer 4 adjacent to the side face portions of each of the second line electrodes 5b may be prevented from discharging, whereby the readout efficiency is improved.

Thereafter, erasing light L2 is irradiated on the radiation image detector 10 for erasing residual charges remaining in the storage section 6 of the radiation image detector 10 after the radiation image is read out. As shown in FIG. 5, the erasing light L2 is irradiated on the radiation image detector 10 from the side of the second electrode layer 5, which is transmitted through the first line electrodes 5a and second line electrodes 5b of the second electrode layer 5, and irradiated on the readout photoconductive layer 4. The erasing light L2 irradiated on the readout photoconductive layer 4 causes electric charge pairs to be generated therein, and positive charges of the charge pairs pass through the charge transport layer 3 to the storage section 6 where they combine with the residual charges and disappear, while the negative charges of the charge pairs combine with positive charges charged on the second line electrodes 5b and disappear.

Here, in the radiation image detector 10 of the present embodiment, the opaque line insulators 5c are formed with a material that transmits the erasing light as described above, so that the residual charges may be erased satisfactorily in the manner as described above. In the radiation image detector 10 of the present embodiment, the opaque line insulators 5c are formed with a material that transmits the erasing light, but if the erasing process is not performed, then the opaque line insulators 5c are not necessarily formed with a material that transmits the erasing light.

Further, the second line electrodes Sb have electrical continuity with the readout photoconductive layer 4. This may prevent the residual charges from remaining on the insulation layer provided on the surface of the second line electrodes 5b as in the radiation image detector 10 shown in FIG. 10C, thereby the quality of the radiation image read out in the next time may be improved.

Figure 6:
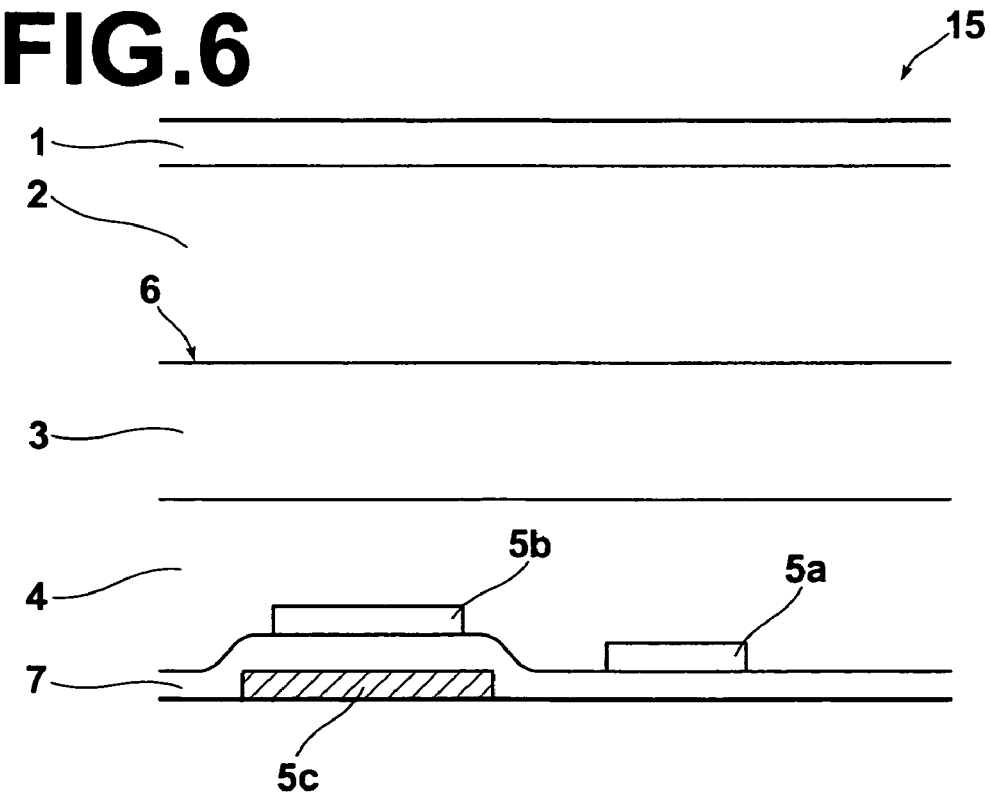
FIG. 6 is a schematic diagram of the radiation image detector according to another embodiment of the present invention.

Still further, instead of providing the second line electrode 5b directly on the opaque line insulator 5c as in the radiation image detector 10 of the present embodiment, a configuration may be adopted in which an insulation film 7 is formed first on the opaque line insulator 5c, and then the second line electrode 5b is formed on the insulation film 7 as shown in FIG. 6. Provision of the insulation film 7 may ensure the flatness of the surface on which the second line electrode 5b is formed, whereby the second line electrode 5b may be formed more appropriately.

Figure 8:
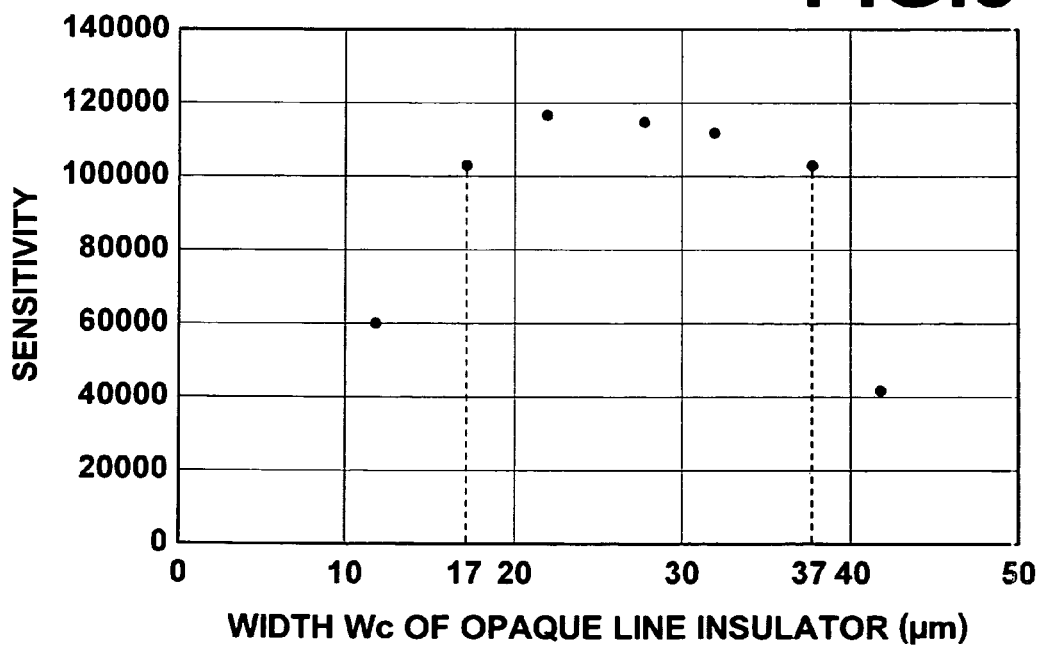
FIG. 8 is a drawing illustrating the relationship between the sensitivity of the radiation image detector and the width of the opaque line insulator.

FIG. 8 shows the relationship between the sensitivity of the radiation image detector 10 and the width Wc of the opaque line insulator 5c when the width Wa of the first line electrode 5a is 10 µm, the width Wb of the second line electrode 5b is 15 µm, and the distance d1 between the first line electrode 5a and the second line electrode 5b is 12.5 µm. As shown in FIG. 8, a sensitivity of over 100000 may be obtained when the width Wc of the opaque line insulator is in the range of 17 µm to 37 µm. Thus, the aforementioned width range is a more preferable width range for the opaque line insulator 5c.

The sensitivity measurement was conducted using the radiation image detector 70 shown in FIG. 9. The radiation image detector 70 is constituted by a layer structure that includes the following in the order listed below: a first electrode layer 71; a recording photoconductive layer 72 made of a-Se; a charge transport layer 73 made of As2Se3; a readout photoconductive layer 74 made of a-Se; and a second electrode layer having a first line electrode 75a made of IZO, a second line electrode 75b, and an opaque line insulator 75c made of a red resist. Further, an insulation film 77 is formed between the opaque line insulator 75c and the first line electrode 75a/second line electrode 75b. A SeAs layer 78 is formed between the insulation film 77/first line electrode 5a/second line electrode 5b and the readout photoconductive layer 74. The thickness of the recording photoconductive layer 72 is 200 µm, the thickness of the charge transport layer 73 is 0.2 µm, the thickness of the readout photoconductive layer 74 is 10 µm, and the thickness of the SeAs layer 78 is 0.05 µm. The SeAs layer is made of Se doped with 10% of As.

As shown in FIG. 9A, 200 mR radiation was irradiated on the radiation image detector 70 from the side of the first electrode layer 71 with a voltage of minus 2 kV being applied to the first electrode layer 71 from a high voltage source 79 to record a radiation image. Thereafter, as shown in FIG. 9B, the integrated value of the currents detected by the integrating amplifier was measured as the sensitivity when blue readout light L1 was irradiated on the detector 70 from the side of the second electrode layer with the first electrode layer being grounded. The blue readout light was irradiated for 1 ms with 50 µW/mm².

In the embodiments described above, the present invention is applied to what is known as the "direct conversion type" radiation image detector, in which a radiation image is recorded in the detector by receiving the radiation and directly converting the radiation to electric charges. The application of the present invention is not limited to this, and it may also be applied, for example, to what is known as the "indirect conversion type" radiation image detector, in which a radiation image is recorded by first converting the radiation to visible light, and then converting the visible light to electric charges.

The layer structure of the radiation image detector of the present invention is not limited to that of the embodiment described above, and a further layer or layers may also be added.

What is claimed is:

1. A radiation image detector comprising a layer structure that includes the following in the order listed below:
   a charge storage layer that generates charges by receiving a recording electromagnetic wave representing a radiation image and stores the generated charges therein;
   a photoconductive layer that generates charges by receiving readout light;
   an electrode layer having a plurality of first line electrodes that transmits the readout light and is disposed in parallel with each other at a predetermined distance,
   wherein:
   a second line electrode having electrical continuity with the photoconductive layer is provided between each of the first electrodes, and an opaque line insulator that blocks the readout light is provided on each of the second line electrodes on the side opposite to the photoconductive layer; and
   the opaque line insulator has such a width that a side face of the opaque line insulator extending in the longitudinal direction thereof resides between the opposing side face portions of adjacent first and second line electrodes extending in the longitudinal direction thereof.

2. The radiation image detector according to claim 1, wherein the opaque line insulator has such a width that the distance between the side faces on the same side of the opaque line insulator extending in the longitudinal direction thereof and the second line electrode extending in the longitudinal direction thereof is greater than the wavelength of the readout light.

3. The radiation image detector according to claim 1, wherein the opaque line insulator has such a width that the distance between the opposing side faces of adjacent opaque line insulator extending in the longitudinal direction thereof and first line electrode extending in the longitudinal direction thereof is greater than or equal to the wavelength of the readout light.

4. The radiation image detector according to claim 1, wherein:
   the photoconductive layer generates charges by receiving erasing light for erasing residual charges remaining in the charge storage layer; and
   the second line electrodes and the opaque line insulators transmit the erasing light.

5. The radiation image detector according to claim 1, wherein each of said opaque line insulator have physical continuity with each of said second line electrodes.

6. The radiation image detector according to claim 1, wherein each of said opaque line insulator is positioned between side portions of adjacent first line electrodes extending in the longitudinal direction.

* * * * *